United States Patent
Bae et al.

(10) Patent No.: US 7,541,199 B2
(45) Date of Patent: Jun. 2, 2009

(54) METHODS OF FORMING MAGNETIC MEMORY DEVICES INCLUDING OXIDIZING AND ETCHING MAGNETIC LAYERS

(75) Inventors: Jun-Soo Bae, Gyeonggi-do (KR); Jong-Bong Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 11/350,545

(22) Filed: Feb. 9, 2006

(65) Prior Publication Data
US 2006/0246604 A1 Nov. 2, 2006

(30) Foreign Application Priority Data
Apr. 18, 2005 (KR) ...................... 10-2005-0032001

(51) Int. Cl.
H01L 21/00 (2006.01)
H01L 21/302 (2006.01)
H01L 21/461 (2006.01)

(52) U.S. Cl. .................... 438/3; 438/705; 257/E21.665

(58) Field of Classification Search ...................... 438/3, 438/705; 257/E21.665
See application file for complete search history.

(56) References Cited

U.S. PATENT DOCUMENTS

| | | | |
|---|---|---|---|
| 6,544,801 B1 * | 4/2003 | Slaughter et al. | 438/3 |
| 6,664,197 B2 * | 12/2003 | Stevens et al. | 438/754 |
| 6,689,622 B1 * | 2/2004 | Drewes | 438/3 |
| 6,815,784 B2 * | 11/2004 | Park et al. | 257/421 |
| 2002/0142491 A1 * | 10/2002 | Shimoda et al. | 438/3 |
| 2003/0219991 A1 * | 11/2003 | Geusic et al. | 438/742 |
| 2004/0157427 A1 * | 8/2004 | Motoyoshi | 438/622 |
| 2005/0023581 A1 * | 2/2005 | Nuetzel et al. | 257/295 |

FOREIGN PATENT DOCUMENTS

| | | |
|---|---|---|
| JP | 2003-078184 | 3/2003 |
| KR | 1020020076107 A | 10/2002 |
| KR | 1020030002142 A | 1/2003 |
| KR | 1020030002142 A | 1/2003 |
| KR | 1020040069061 A | 8/2004 |
| KR | 10-2004-0110380 A | 12/2004 |
| KR | 1020030039816 | * 12/2004 |
| KR | 1020040110482 | 12/2004 |
| KR | 1020040110482 A | 12/2004 |
| KR | 1020050017042 A | 2/2005 |

OTHER PUBLICATIONS

Notice to Submit Response in Korean Application No. 10-2005-0032001; Date of mailing Jun. 29, 2006.
Translation of Notice to Submit Response in Korean Application No. 10-2005-0032001; Date of mailing Jun. 29, 2006.

* cited by examiner

*Primary Examiner*—M. Wilczewski
*Assistant Examiner*—Daniel Luke
(74) *Attorney, Agent, or Firm*—Myers Bigel Sibley & Sajovec

(57) ABSTRACT

Methods of forming a magnetic memory device include oxidizing a top magnetic layer using a conductive capping pattern as a mask. An etch selectivity between an oxidized portion of the top magnetic layer and a tunnel barrier layer may be relatively high. Using the tunnel barrier layer as an etch-stop layer, the oxidized portion of the top magnetic layer is selectively removed to form a top magnetic pattern, and to expose at least a portion of opposite sidewalls of the top magnetic pattern and the tunnel barrier layer. The unoxidized portion of the top magnetic layer forms a top magnetic pattern.

16 Claims, 8 Drawing Sheets

METHODS OF FORMING MAGNETIC MEMORY DEVICES INCLUDING OXIDIZING AND ETCHING MAGNETIC LAYERS

CLAIM OF PRIORITY

This application claims priority under 35 U.S.C. § 119 from Korean Patent Application No. 2005-32001, filed on Apr. 18, 2005 in the Korean Intellectual Property Office, the disclosure of which is incorporated herein by reference as if set forth in its entirety.

FIELD OF THE INVENTION

The present invention relates to methods of forming semiconductor devices and, more particularly, to methods of forming semiconductor memory devices and resulting semiconductor memory devices.

BACKGROUND

A magnetic memory device is a kind of a non-volatile memory device in which data is programmed or erased using a magnetic field. With the potential benefits of high speed, low density, and/or non-volatility, magnetic memory devices are increasingly becoming attractive as novel memory devices.

A typical magnetic memory device employs a magnetic tunnel junction (MTJ) pattern as a data storage element. The resistance of the MTJ pattern varies with an external magnetic field, which leads to a change in the amount of current flowing through the MTJ pattern. The change in the amount of the current is sensed to indicate a logic "1" or a logic "0".

Generally, an MTJ pattern includes two magnetic layers and a tunnel barrier layer interposed therebetween. One of the magnetic layers has a changeable magnetization orientation when a magnetic field is applied, while the other has a fixed magnetization orientation even when a magnetic field is applied. Therefore, the two magnetic layers may have the same magnetization orientation or opposite magnetization orientations. The resistance of the MTJ pattern in which the two magnetic layers have the same magnetization orientation is lower than when the two magnetic layers are in different magnetization orientations.

A method of forming a conventional magnetic memory device will now be described with reference to FIG. 1 and FIG. 2.

Referring to FIG. 1, a bottom magnetic layer 2, a tunnel barrier layer 3, a top magnetic layer 4, and a conductive capping layer 5 are formed in order on a substrate 1. The bottom magnetic layer 2 has a fixed magnetization orientation. That is, the magnetization orientation of the bottom magnetic layer 2 may be continuously fixed even when an external magnetic field is applied. Furthermore, the magnetization orientation of the top magnetic layer 4 is changeable with an external magnetic field.

Referring to FIG. 2, the conductive capping layer 5, the top magnetic layer 4, the tunnel barrier layer 3, and the bottom magnetic layer 2 are successively patterned to form a bottom magnetic pattern 2a, a tunnel barrier pattern 3a, a top magnetic pattern 4a, and a capping pattern 5a that are stacked in order on the substrate 1. The bottom magnetic pattern 2a, the tunnel barrier pattern 3a, and the top magnetic pattern 4a form a MTJ pattern.

During an etch process to form the MTJ pattern, an etch byproduct 6 may be produced on a sidewall of the MTJ pattern. Since the etch byproduct 6 may include conductive materials from the bottom and/or top magnetic patterns 2a and 5a, it may become conductive, which may cause a short-circuit between the bottom and top magnetic patterns 2a and 5a. Thus, the desired property of the MTJ pattern (namely, that the resistance varies with the magnetization orientations of the magnetic patterns 2a and 5a) may be lost, which may result in a malfunction of the magnetic memory device.

SUMMARY

Some embodiments of the present invention provide methods of forming magnetic memory devices. In some embodiments, a first magnetic layer, a tunnel barrier layer, and a second magnetic layer are sequentially formed on a semiconductor substrate. The first magnetic layer may have a fixed magnetization orientation, and the second magnetic layer may have a changeable magnetization orientation. A conductive capping pattern is formed on the second magnetic layer, and portions of the second magnetic layer are oxidized using the conductive capping pattern as a mask, to form an unoxidized second magnetic pattern that is disposed below the conductive capping pattern. The oxidized portion of the second magnetic layer is removed to expose the tunnel barrier layer and opposite sidewalls of the second magnetic pattern. The second magnetic layer may include a ferromagnetic material such as iron (Fe), nickel (Ni), and/or cobalt (Co).

In some embodiments, a first magnetic layer, a tunnel barrier layer, and a second magnetic layer may be sequentially formed on a substrate. The first magnetic layer may have a fixed magnetization orientation and the second magnetic layer may include cobalt-iron-boron (CoFeB). A conductive capping pattern may be formed on the second magnetic layer, and the second magnetic layer may be oxidized using the conductive capping pattern as a mask to form a second magnetic pattern that is an unoxidized portion of the second magnetic layer disposed below the conductive capping pattern. The oxidized portion of the second magnetic layer may be removed to expose the tunnel barrier layer and opposite sidewalls of the second magnetic pattern. The exposed tunnel barrier layer and the first magnetic layer may be successively patterned to form a first magnetic pattern and a tunnel barrier pattern. A second surface of the tunnel barrier layer may be larger than a first surface of the second magnetic pattern. Removing the oxidized portion of the second magnetic layer may be done by means of an etch process using an etch gas including argon gas, chlorine gas, and/or oxygen gas.

A magnetic memory device according to some embodiments of the invention includes a first magnetic layer having opposing sidewalls, a tunnel barrier layer on the first magnetic layer, the tunnel barrier layer having a top surface and having opposing sidewalls aligned with the opposing sidewalls of the first magnetic layer, and a second magnetic layer on the tunnel barrier layer, the second magnetic layer having a bottom surface that may be narrower than the top surface of the tunnel barrier layer and opposing side surfaces that are spaced apart from the opposing side surfaces of the tunnel barrier layer. A conductive capping layer having opposing sidewalls aligned with the opposing sidewalls of the second magnetic layer is on the second magnetic layer.

The first magnetic layer may include a pinning layer, a first pinned layer, an inversion layer, and a second pinned layer. The first and second pinned layers include a ferromagnetic material, the pinning layer may include an antiferromagnetic material configured to fix a magnetization orientation of the first pinned layer, and the inversion layer may be configured to fix a magnetization orientation of the second pinned layer to be opposite to the magnetization orientation of the first pinned layer. The tunnel barrier layer may include aluminum oxide and/or magnesium oxide.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
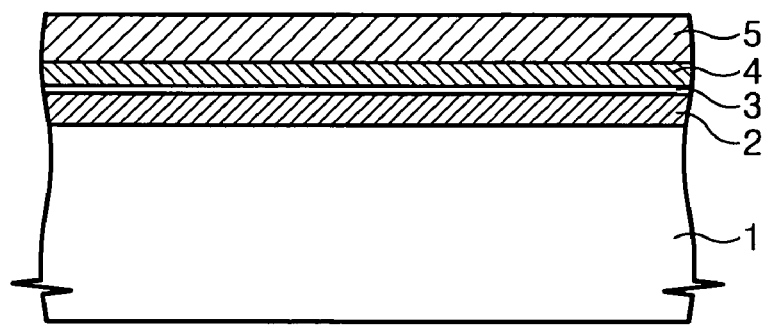
FIG. 1 and FIG. 2 are cross-sectional views illustrating operations associated with forming a conventional magnetic memory device.
Figure 2:
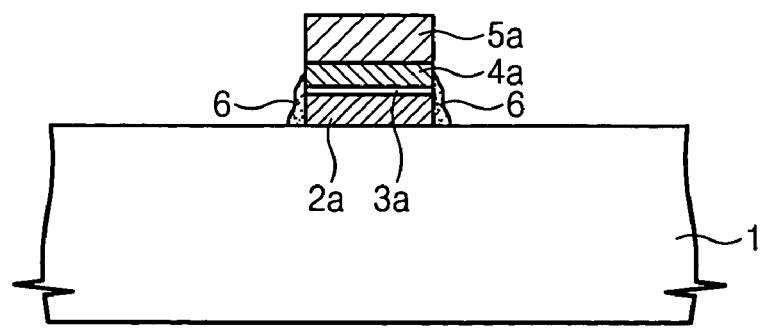

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures. For example, a layer designated as a "top" layer of a structure may become a bottom layer if the structure is inverted.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 3:
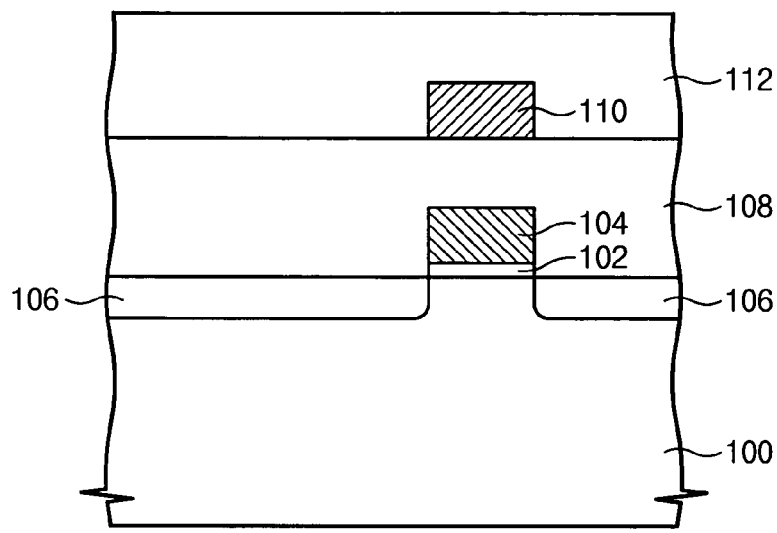
FIG. 3 through FIG. 10 are cross-sectional views illustrating operations associated with forming magnetic memory devices according to some embodiments of the present invention.

Referring to FIG. 3, device isolation layers (not shown) are formed in a semiconductor substrate 100 to define active regions. A gate electrode 104 is formed to cross over the active regions with a gate insulator 102 interposed therebetween. The gate insulator 102 may be made of silicon oxide and/or a high-k dielectric, such as metal oxide (e.g., hafnium oxide and/or aluminum oxide) having a higher dielectric constant than silicon oxide. The gate electrode 104 may include a conductive material, such as doped polysilicon, metal (e.g., tungsten or molybdenum), conductive metal nitride (e.g., titanium nitride or tantalum nitride), and/or metal silicide (e.g., tungsten silicide or cobalt silicide).

Using the gate electrode 104 as a mask, impurity ions are implanted to form impurity diffusion layers 106 at active regions on opposite sides of the gate electrode 104. The impurity diffusion layer 106 may correspond to source/drain regions, and the gate electrode 104 and the impurity diffusion layer 106 may together form a metal oxide semiconductor (MOS) transistor. An insulative capping pattern (not shown) may be formed on the gate electrode 104. Further, a gate spacer (not shown) may be formed on opposite sidewalls of the gate electrode 104.

A lower interlayer dielectric 108 is formed on the surface of the semiconductor substrate 100 including the gate electrode 104 and the impurity diffusion layer 106. A top surface of the lower interlayer dielectric 108 may be planarized. The lower interlayer dielectric 108 may include, for example, silicon oxide.

A digit line 110 is formed on the lower interlayer dielectric 108. The digit line 110 may be disposed in parallel with the gate electrode 104. In order to possibly provide enhanced integration density, the digit line 110 may overlap the gate electrode 104. The digit line 110 and the gate electrode 104 are insulated from one another by the lower interlayer dielectric 108. A middle interlayer dielectric 112 is formed on an entire surface of the semiconductor substrate 100 including the digit line 110. A top surface of the middle interlayer dielectric 112 may be planarized. The middle interlayer dielectric 112 may include, for example, silicon oxide.

Figure 4:
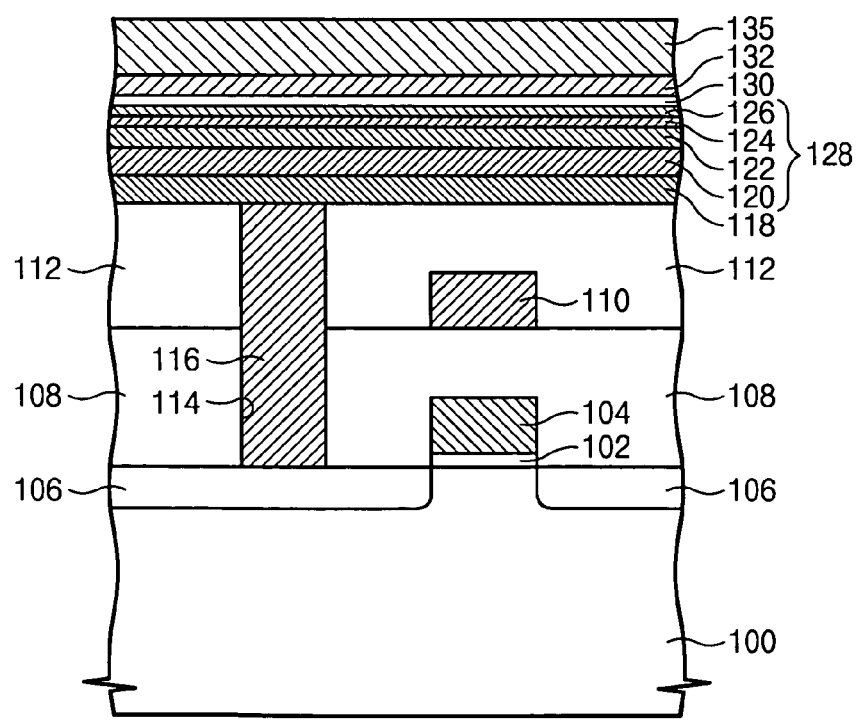

Referring to FIG. 4, a contact hole 114 is formed by successively penetrating the middle and lower interlayer dielectrics 112 and 108 disposed at one side of the digit line 110 to expose the impurity diffusion layer 106. A contact plug 116 is formed to at least partially fill the contact hole 114. The contact plug 116 and the digit line 110 are spaced to be electrically insulated from each other.

In order to reduce the aspect ratio of the contact hole 114, the contact hole 114 may be formed to expose a buffer pattern (not shown) that is formed between the lower and the middle interlayer dielectrics 108 and 112 and that is spaced apart from the digit line 110. In that case, the contact plug 116 is electrically connected to the buffer pattern. The buffer pattern may be made of the same material as the digit line 110. The buffer pattern is connected to a top surface of a lower contact plug (not shown), which is coupled to the impurity diffusion layer 106, through the lower interlayer dielectric 108.

A bottom electrode layer 118, a bottom magnetic layer 128, a tunnel barrier layer 130, a top magnetic layer 132, and a conductive capping layer 135 are sequentially formed on the middle interlayer dielectric 112. The bottom electrode layer 118 is electrically connected to a top surface of the contact plug 116. In order to provide a relatively low reactivity, the bottom electrode layer 118 may include a conductive material that may act as a barrier layer. For example, the bottom electrode layer 118 may include a conductive metal nitride such as, for example, titanium nitride, tantalum nitride and/or tungsten nitride.

The bottom magnetic layer 128 may have a fixed magnetization orientation. The bottom magnetic layer 128 may include a pinning layer 120, a first pinned layer 122, an inversion layer 124, and a second pinned layer 126 that may be stacked in order on the bottom electrode layer 118.

Each of the first and second pinned layers 122 and 126 is made of a ferromagnetic material including, for example, iron (Fe), nickel (Ni), and/or cobalt (Co). In some embodiments, each of the first and second pinned layers 122 and 126 may include CoFe, NiFe and/or CoFeB. Of the first and second pinned layers 122 and 126, the second pinned layer 126 disposed near the top magnetic layer 132 may be thinner than the first pinned layer 122.

The pinning layer 120 includes a material capable of fixing the magnetization orientation of the first pinned layer 122 in one direction. Accordingly, the pinning layer 120 may include an antiferromagnetic material such as, for example, FeMn, IrMn, PtMn, MnO, MnS, MnTe, $MnF_2$, $FeF_2$, $FeCl_2$, NiO, and/or Cr. The inversion layer 124 may include a material capable of fixing the magnetization orientation of the second pinned layer 126 to be opposite to the magnetization of the first pinned layer 122. Accordingly, the inversion layer 124 may include, for example, ruthenium (Ru), iridium (Ir), and/or rhodium (Rh).

The tunnel barrier layer 130 may include, for example, aluminum oxide and/or magnesium oxide. The top magnetic layer 132 may include a material whose magnetic orientation is changeable with an external magnetic field. Accordingly, the top magnetic layer 132 may include a ferromagnetic material such as, for example, iron (Fe), nickel (Ni), and/or cobalt (Co). Namely, the top magnetic layer 132 may include, for example, CoFe, NiFe and/or CoFeB.

Figure 5:
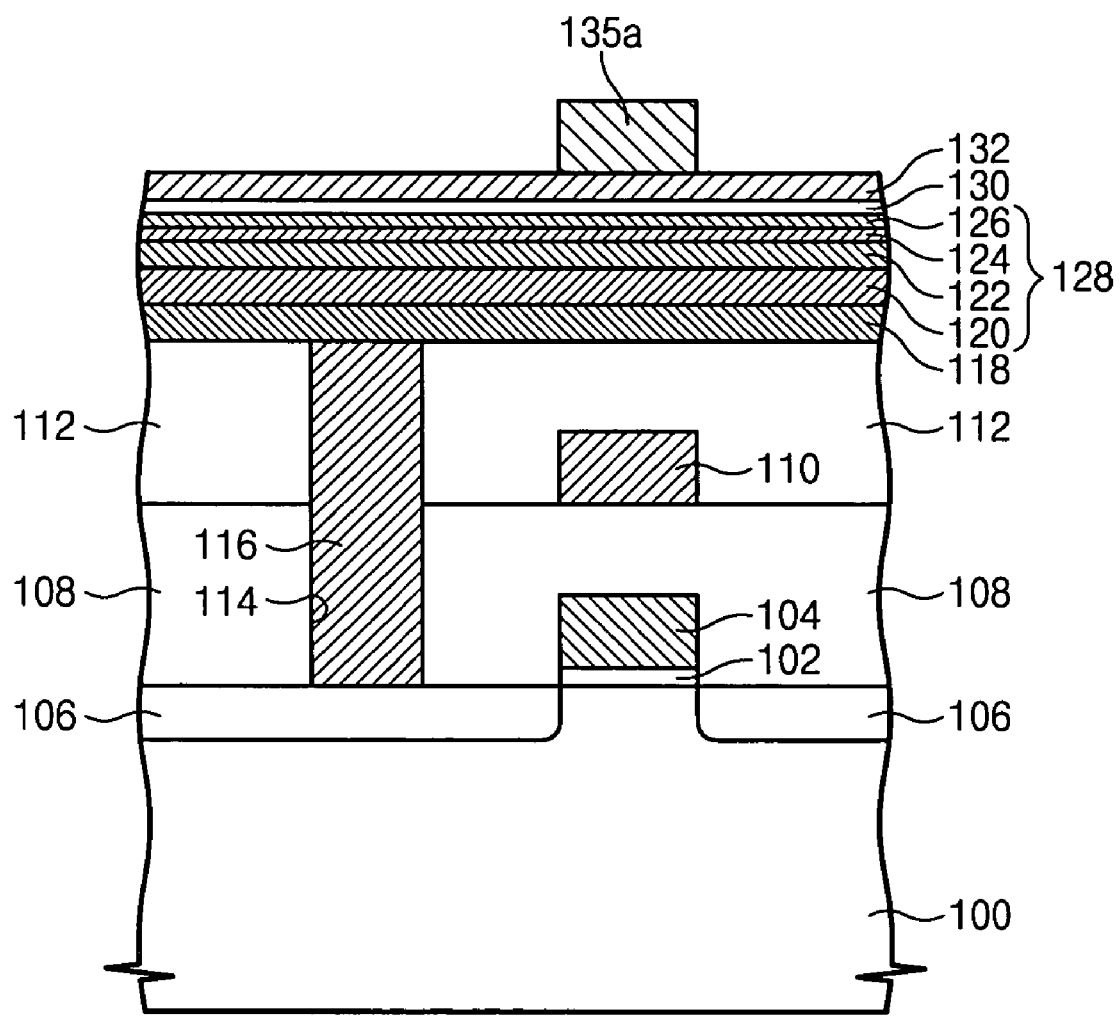

The conductive capping layer 135 may include a conductive metal nitride, such as titanium nitride, tantalum nitride and/or tungsten nitride. Referring to FIG. 5, the conductive capping layer 135 may be patterned to form a conductive capping pattern 135a on the top magnetic layer 132. The conductive capping pattern 135a may be disposed to overlap the digit line 110. In regions other than the region in which the conductive capping pattern 135a is formed, the top magnetic layer 132 is exposed. The conductive capping pattern 135a may form an island-shaped pattern. In particular, the conductive capping pattern 135a may appear rectangular when viewed from above.

Figure 6:
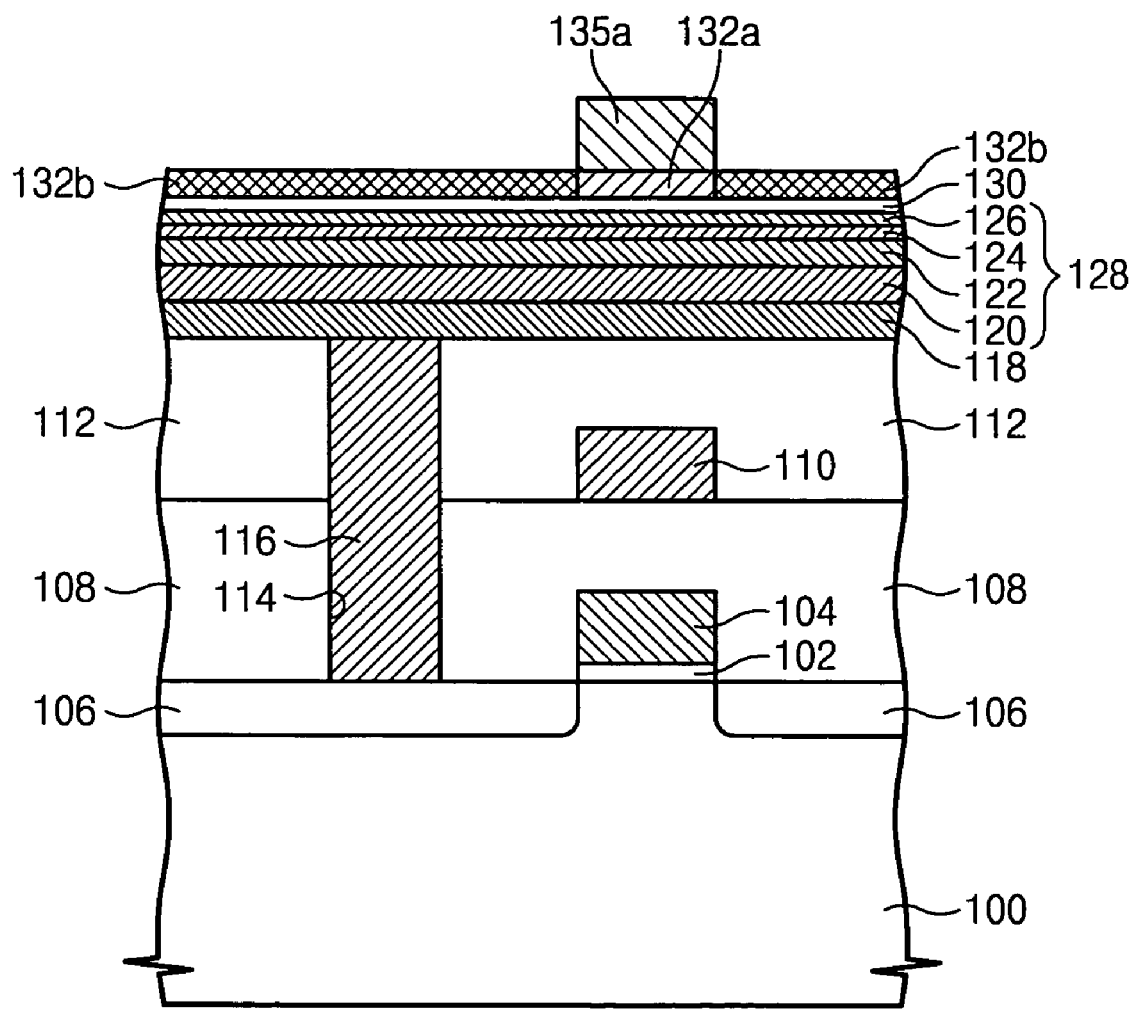
Figure 7:
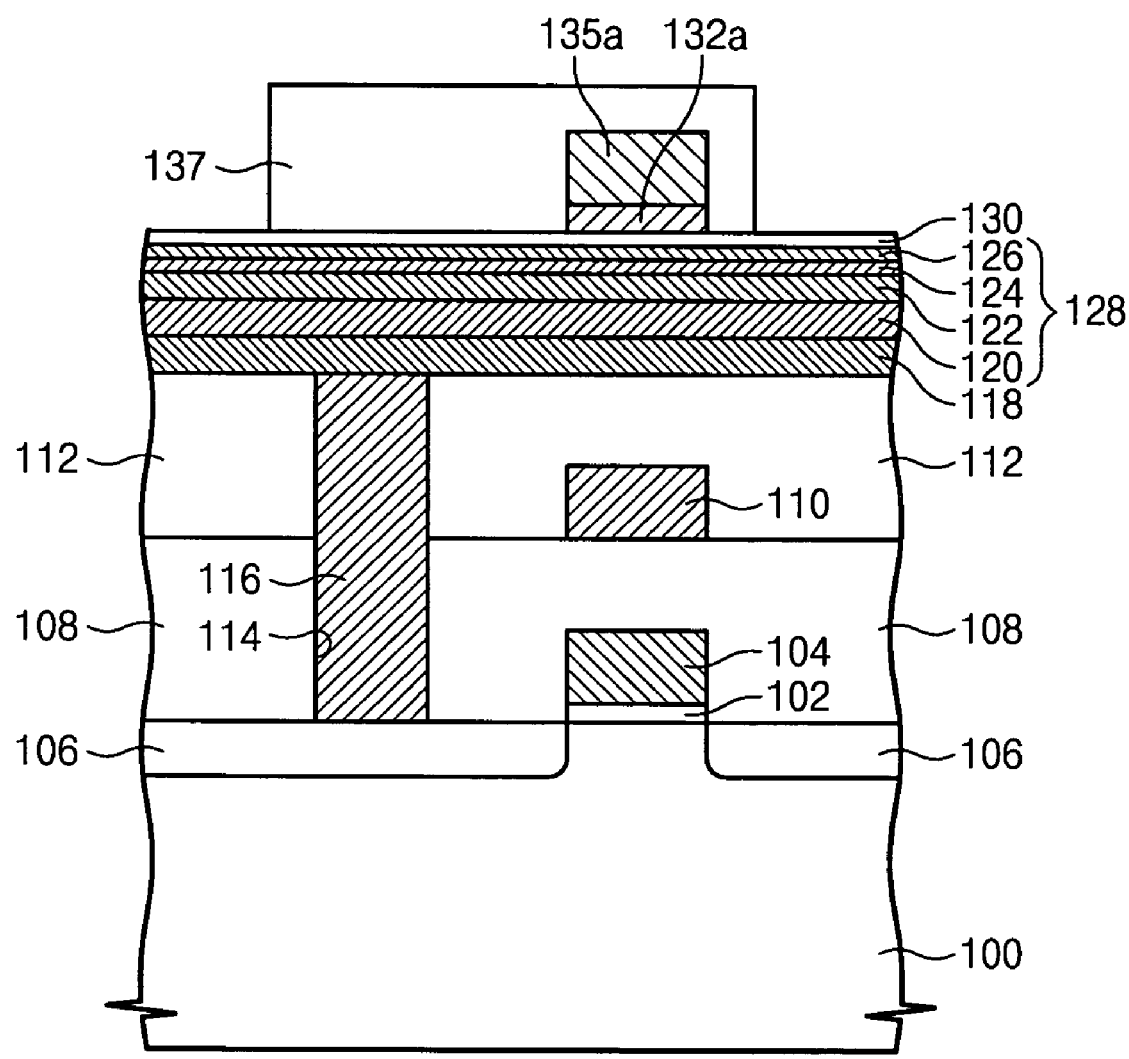

Referring to FIG. 6 and FIG. 7, an oxidation process is performed on the semiconductor substrate 100 including the conductive capping pattern 135a to oxidize the top magnetic layer 132. That is, using the conductive capping pattern 135a as a mask, the top magnetic layer 132 may be oxidized. As a result, the top magnetic layer 132 may be segmented into an unoxidized portion 132a and an oxidized portion 132b. The unoxidized portion 132a is disposed below the conductive capping pattern 135a, and the oxidized portion 132b may surround the unoxidized portion 132a.

The unoxidized portion 132a defines as a top magnetic pattern 132a. Since the top magnetic layer 132 is made of a ferromagnetic material, the top magnetic pattern 132a may form a ferromagnetic pattern. The oxidized portion 132b of the top magnetic layer 132 is an oxidized ferromagnetic material 132b. Hereinafter, the oxidized portion 132b of the top magnetic layer may be referred to as the oxidized ferromagnetic material 132b.

The oxidized portion 132b is removed by means of an etch process to expose sidewalls of the top magnetic pattern 132a and the tunnel barrier layer 130. In some embodiments, the oxidized portion 132b may be removed completely. Using the conductive capping pattern 135a as a mask, the top magnetic pattern 132a is formed to overlap the digit line 110. An etch gas used to etch the oxidized ferromagnetic material 132b may include, for example, at least argon gas (Ar) and chlorine gas. In addition, the etch gas may further include oxygen gas. In the etch process, an inflow rate of the chlorine gas may be much lower than that of the argon gas. Specifically, the inflow rate of the chlorine gas may equal about to 0.1 to 2.0 percent of the inflow rate of the argon gas. Further, the etch process may utilize a bias power of from about 30 to about 70 watts.

There may be a very high etch selectivity between the oxidized ferromagnetic material 132b and the tunnel barrier layer 130. In particular, the etch selectivity between the oxidized ferromagnetic material 132b and the tunnel barrier layer 130 may be higher than the etch selectivity between the top magnetic pattern (i.e., unoxidized ferromagnetic) 132a and the tunnel barrier layer 130. This may be because oxygen elements in the oxidized ferromagnetic 132b may reduce the coupling of other elements therein. Therefore, although the tunnel barrier layer 130 may have a very small thickness of about 10 angstroms, the oxidized ferromagnetic material 132b may be removed using the tunnel barrier layer 130 as an etch-stop layer. Accordingly, the bottom magnetic layer 128 below the tunnel barrier layer 130 may not be exposed in the etch process. As a result, a short-circuit may not occur between the top magnetic pattern 132a and the bottom magnetic layer 128 even if etch byproducts are produced in the etch process.

A test was conducted to confirm an etch selectivity between an oxidized ferromagnetic material and a tunnel barrier layer, and an etch selectivity between a ferromagnetic material and the tunnel barrier layer. Samples 1, 2, and 3 were prepared for the test. A layer of $Al_2O_3$ layer acting as a tunnel barrier layer, a layer of CoFeB being ferromagnetic, and a layer of $CoFeBO_x$ being oxidized ferromagnetic were formed in the samples 1, 2, and 3, respectively. Under the same etch recipe, an etch process was performed for the samples 1, 2, and 3.

The etch process applied to the test used an etch gas including argon gas, chlorine gas, and oxygen gas. In the etch recipe for the etch process, an inner pressure of a process chamber was 10 mTorr; an inflow rate of the argon gas was 200 sccm, an inflow rate of the chlorine gas was 1 sccm, and an inflow rate of the oxygen gas was 20 sccm. Source power for plasmatically activating these etch gases was 1,500 watts, and bias power applied to a chuck on which these samples are loaded was 50 watts. Etch rates of the above material layers are shown in the table [TABLE 1].

TABLE 1

| Kind of Layers | Etch Rate (Å/sec) |
|---|---|
| $Al_2O_3$ | 0.0014 |
| CoFeB | 0.0260 |
| $CoFeBO_x$ | 0.0339 |

As shown in the table [TABLE 1], $CoFeBO_x$ of the sample 3 has a higher etch rate than CoFeB of the sample 2, i.e., $CoFeBO_x$ is etched faster than CoFeB. Etch selectivities between these material layers were computed using the etch rates of the table [TABLE 1] and are shown in the table [TABLE 2].

TABLE 2

| | Etch Selectivity |
|---|---|
| $CoFeB/Al_2O_3$ | 18.5 |
| $CoFeBO_x/Al_2O_3$ | 24.2 |

As shown in the table [TABLE 2], an etch selectivity between $CoFeBO_x$ and $Al_2O_3$ is 24.2, which is higher than an etch selectivity (18.5) between CoFeB and $Al_2O_3$.

As evidenced by the above-described test, an oxidized ferromagnetic material may have a higher etch rate than an unoxidized ferromagnetic material. Therefore, an etch selectivity between the oxidized portion 132b of the top magnetic layer 132 and the tunnel barrier layer 130 may relatively high. As a result, the oxidized portion 132b may be efficiently removed using the tunnel barrier layer 130 as an etch-stop layer. Although etch byproducts may be produced in the etch process, a short-circuit may not occur between the top magnetic pattern 132a and the bottom magnetic layer 128 because the bottom magnetic layer 128 may remain covered with the tunnel barrier layer 130.

As previously stated, the inflow rate of the chlorine gas may be equal to about 0.1 to 2.0 percent of the inflow rate of the argon gas. The amount of the chlorine gas used may be much smaller than that of the argon gas used. Since chlorine gas has a high reactivity, use of a smaller amount of the chlorine gas enables the etch process to have a higher etchability than an etchability based on chemical reaction. The bias power of the etch process may be relatively low (from about 30 to about 70 watts), which may reduce etch damage to the tunnel barrier layer 130 and/or may enhance an etch selectivity between the oxidized portion 132b of the top magnetic layer 132 the tunnel barrier layer 130 (as atomic coupling of the oxidized portion 132b may be weakened by oxygen elements).

The above-described effects may be obtained even if the tunnel barrier layer 130 is made of magnesium oxide.

The oxidized portion 132b of the top magnetic layer 132 is removed by means of the etch process to expose opposite sidewalls of the top magnetic pattern 132a.

The oxidized portion 132b, i.e., the oxidized ferromagnetic material 132b of the top magnetic layer 132, may have an antiferromagnetic property. Accordingly, if the oxidized ferromagnetic material 132b partially remains on the sidewall(s) of the top magnetic pattern 132a, the magnetization orientation of the top magnetic pattern 132a may be fixed due to the remaining oxidized ferromagnetic material 132b. Thus, the property of a magnetic tunnel junction pattern may be lost, which may cause a malfunction of a magnetic memory device.

However, according to some embodiments of the invention, the oxidized portion 132b of the top magnetic layer 132 may be completely removed by means of the etch process to reduce or possibly prevent the magnetization direction of the top magnetic pattern 132a from becoming fixed on one direction.

Referring to FIG. 7, a mask pattern 137 may be formed on portions of the semiconductor substrate 100 where the oxidized portion 132b of the top magnetic layer 132 has been removed. The mask pattern 137 is provided on the conductive capping pattern 135a and the top magnetic pattern 132a. In particular, in some embodiments, the mask pattern 137 may fully cover the opposite sidewalls of the top magnetic pattern 132a. Namely, a planar area of the mask pattern 137 may be larger than a top surface of the conductive capping pattern 135a. Thus, the mask pattern 137 may be provided on a portion of the tunnel barrier layer 130 in the vicinity of the conductive capping pattern 135a. Also the mask pattern 137 may extend laterally over the contact plug 116. The mask pattern 137 may be a photoresist pattern.

Figure 8:
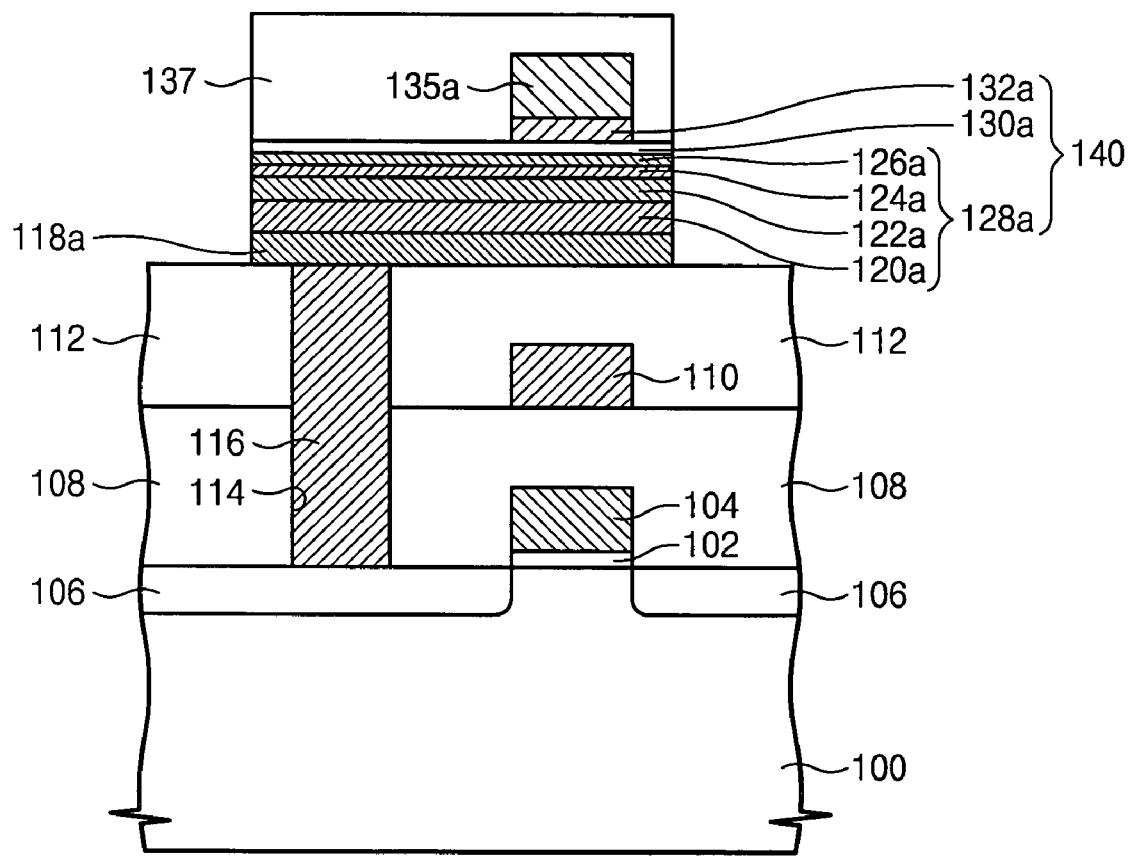

Referring to FIG. 8, using the mask pattern 137 as a mask, the tunnel barrier layer 130, the bottom magnetic layer 128, and the bottom electrode layer 118 are successively etched to form a bottom electrode 118a, a bottom magnetic pattern 128a, and a tunnel barrier pattern 130a which are sequentially stacked on the substrate 100. The bottom magnetic pattern 128a includes a pinning pattern 120a, a first pinned pattern 122a, an inversion pattern 124a, and a second pinned pattern 126a, which are sequentially stacked on the substrate 100. The bottom magnetic pattern 128a, the tunnel barrier pattern 130a, and the top magnetic pattern 132a may together form a magnetic tunnel junction pattern.

A top surface of the tunnel barrier pattern 130a is larger than a bottom surface of the top magnetic pattern 132a, and the bottom magnetic pattern 128a has a sidewall aligned with a sidewall of the tunnel barrier pattern 130a. In addition, the sidewall of the top magnetic pattern 132a and the sidewall of the bottom magnetic pattern 128a may be spaced apart from each other.

In an etch process to form the tunnel barrier pattern 130a and the bottom magnetic pattern 128a, the conductive capping pattern 135a may be provided on the top surface of the top magnetic pattern 132a and the mask pattern 137 may be provided on an exposed sidewall of the top magnetic pattern 132a. Therefore, although byproducts may be produced in the etch process to form the patterns 130a and 128a, a short-circuit may not occur between the patterns 132a and 128a.

The first and second pinned patterns 122a and 126a are ferromagnetic patterns each having a fixed magnetization orientation. Accordingly, magnetic fields generated by the first and second pinned patterns 122a and 126a may affect the top magnetic pattern 132a. The magnetization orientations of the first and second patterns 122a and 126a may be opposite to each other due to the presence of the inversion pattern 124a. Hence, the magnetic fields affecting the top magnetic pattern 132a may be offset by the first and second pinned patterns 122a and 126a. As a result, the top magnetic pattern 132a may not be affected by the magnetic fields established from the first and second patterns 122a and 126a, Moreover, the first pinned pattern 122a may be thicker than the second pinned pattern 126a. Therefore, it may be possible to counterbalance a magnetic field intensity difference resulting from a difference in distance between the first and second pinned patterns 122a and 126a and the top magnetic pattern 132a.

Figure 9:
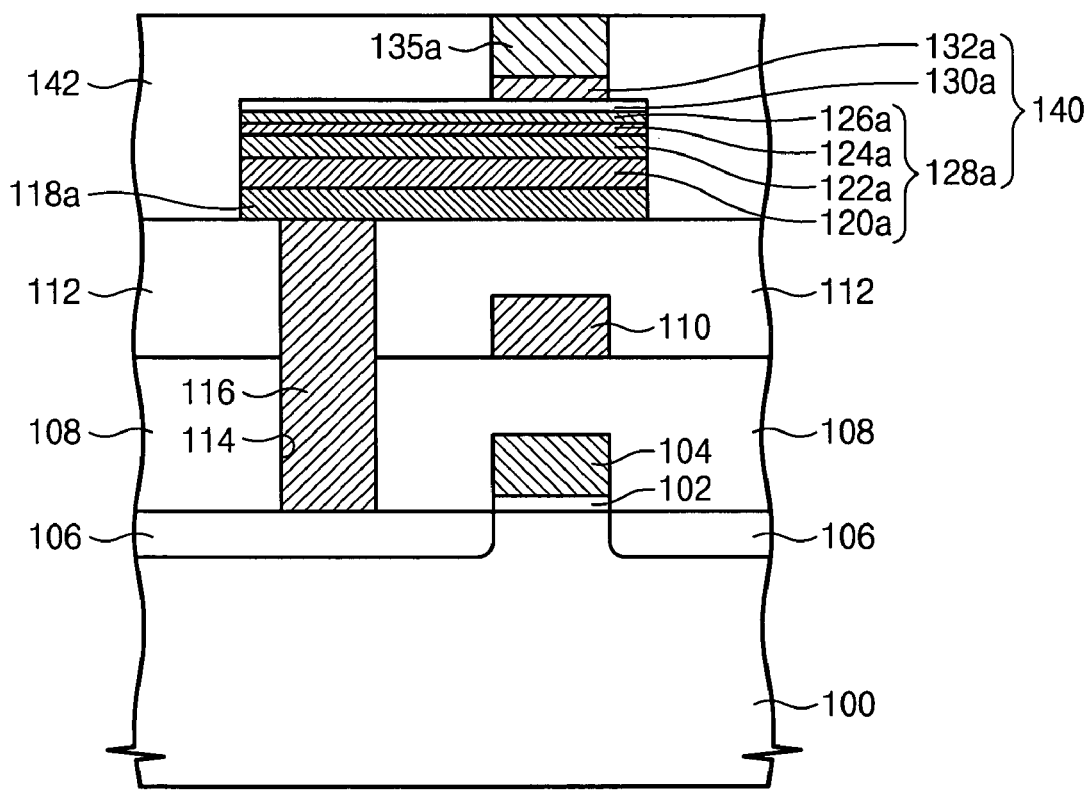

Referring to FIG. 9, the mask pattern 137 is removed. An upper interlayer dielectric 142 may be formed on a surface of the semiconductor substrate 100 above the conductive capping pattern 135a and the MTJ pattern 140. The upper interlayer dielectric 142 may include, for example, silicon oxide.

A top surface of the conductive capping pattern 135a may be exposed. A way to expose the top surface of the conductive capping pattern 135a is now described. The upper interlayer dielectric 142 is planarized down to the top surface of the conductive capping pattern 135a. Thus, the top surface of the conductive capping pattern 135a is at least partially exposed. Alternatively, a contact hole (not shown) may be formed to penetrate the upper interlayer dielectric 142. That is, at least a portion of the top surface of the conductive capping pattern 135a may be exposed by the contact hole.

When the top magnetic layer 132 is oxidized, an oxide layer may be formed on the top surface of the conductive capping pattern 135a. The oxide layer is removed when the top surface of the conductive capping pattern 135a is exposed. That is, the oxide layer formed on the top surface of the conductive capping pattern 135a is removed when the upper interlayer dielectric 142 is planarized and/or the contact hole is formed.

Figure 10:
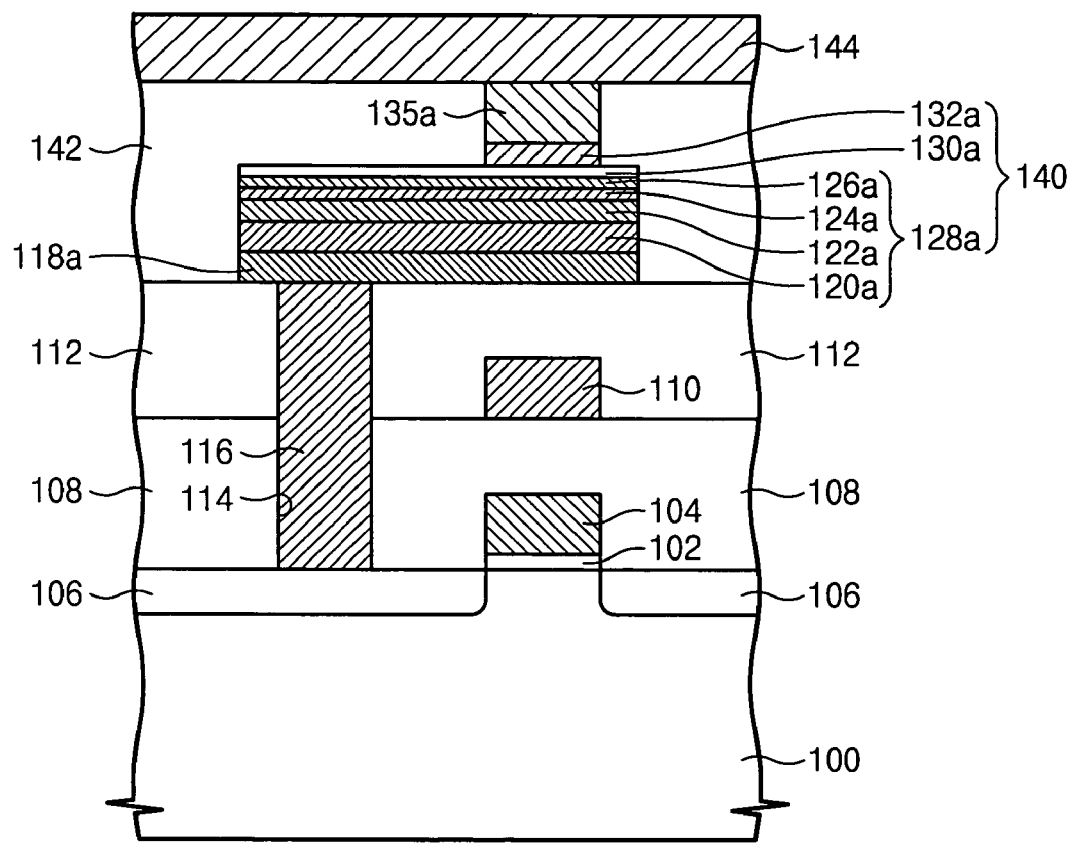

Referring to FIG. 10, a bitline 144 is formed on the upper interlayer dielectric 142 to cross over the digit line 110. The bitline 144 is electrically connected to the exposed conductive capping pattern 135a. The bitline 144 covers the top magnetic pattern 132a. The top magnetic pattern 132a is disposed between the bitline 144 and the digit line 110. In other words, the top magnetic pattern 132a is disposed at an intersection of the bitline 144 and the digit line 110. As a result, the magnetization orientation of the top magnetic pattern 135a may vary with magnetic fields established between the bitline 144 and the digit line 110.

According to some embodiments of the invention, a top magnetic layer is oxidized using a conductive capping pattern as a mask to enhance an etch selectivity between a tunnel barrier layer and a portion where the top magnetic layer is removed. Thus, an oxidized portion of the top magnetic layer may be efficiently removed using the tunnel barrier layer as an etch-stop layer. Since a bottom magnetic layer is covered with the tunnel barrier layer during an etch process to remove the oxidized portion of the top magnetic layer, a short-circuit may not occur between the top magnetic pattern and the bottom magnetic layer even if etch byproducts are produced in the etch process. The oxidized portion of the top magnetic layer may be fully removed to expose opposite sidewalls of a top magnetic pattern. The oxidized portion of the top magnetic layer, which has an antiferromagnetic property, may be removed to reduce or prevent degradation in characteristics of the top magnetic pattern.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a magnetic memory device, comprising:
   sequentially forming a first magnetic layer, a tunnel barrier layer, and a second magnetic layer on a semiconductor substrate, the first magnetic layer having a fixed magnetization orientation and the second magnetic layer having a changeable magnetization orientation;
   forming a conductive capping pattern on the second magnetic layer;
   oxidizing the second magnetic layer, using the conductive capping pattern as a mask, to form an unoxidized second magnetic pattern below the conductive capping pattern; and
   removing an oxidized portion of the second magnetic layer to expose at least a portion of an upper surface of the tunnel barrier layer opposite the substrate and to expose opposing sidewalls of the second magnetic pattern;
   wherein the upper surface of the tunnel barrier layer is wider than the second magnetic pattern.

2. The method of claim 1, wherein the second magnetic layer comprises a ferromagnetic material including iron (Fe), nickel (Ni), and/or cobalt (Co).

3. The method of claim 1, wherein:
   removing the oxidized portion of the second magnetic layer comprises etching the oxidized portion of the second magnetic layer using an etch gas including at least argon gas and chlorine gas.

4. The method of claim 3, wherein:
   during the etching, an inflow rate of the chlorine gas is about 0.1 to about 2.0 percent of an inflow rate of the argon gas.

5. The method of claim 3, wherein:
   the etching is performed using a bias power of from about 30 to about 70 watts.

6. The method of claim 1, wherein:
   the first magnetic layer comprises a pinning layer, a first pinned layer, an inversion layer, and a second pinned layer,
   the pinning layer is configured to fix a magnetization orientation of the first pinned layer, and the inversion layer is configured to fix a magnetization orientation of the second pinned layer to be opposite to the magnetization orientation of the first pinned layer.

7. The method of claim 6, wherein:
   the first and second pinned layers comprise a ferromagnetic material;
   the pinning layer comprises an antiferromagnetic material; and
   the inversion layer comprises ruthenium (Ru), iridium (Ir), and/or rhodium (Rh).

8. The method of claim 6, wherein:
   the first pinned layer is thicker than the second pinned layer.

9. The method of claim 1, further comprising:
   successively patterning the exposed tunnel barrier layer and the first magnetic layer to form a first magnetic pattern and a tunnel barrier pattern,
   wherein an upper surface of the tunnel barrier pattern is wider than a first surface of the second magnetic pattern that is in contact with the tunnel barrier pattern.

10. The method of claim 9, wherein forming the first magnetic layer is preceded by:
   forming a first interlayer dielectric on the semiconductor substrate;
   forming a contact plug to penetrate the first interlayer dielectric; and
   forming a first electrode layer on the first interlayer dielectric to contact the contact plug,
   wherein forming the tunnel barrier pattern and the first magnetic pattern comprises:
   successively patterning the exposed tunnel barrier layer, the first magnetic layer, and the first electrode layer to form a first electrode, a first magnetic pattern, and a tunnel barrier pattern,
   the first electrode contacting the contact plug.

11. The method of claim 10, further comprising:
   forming a digit line on the semiconductor substrate;
   forming a second interlayer dielectric above the conductive capping pattern, the second magnetic pattern, the tunnel barrier pattern, the first magnetic pattern, and the first electrode;
   exposing a second surface of the conductive capping pattern; and
   forming a bitline on the second interlayer dielectric to contact the second surface of the conductive capping pattern and cross over the digit line,
   wherein the first interlayer dielectric is formed above the digit line;
   the second magnetic pattern is disposed between the digit line and the bitline; and
   the contact plug is laterally spaced apart from the digit line.

12. The method of claim 1, wherein:
   the tunnel barrier layer comprises aluminum oxide and/or magnesium oxide.

13. A method of forming a magnetic layer, comprising:
   sequentially forming a first magnetic layer, a tunnel barrier layer, and a second magnetic layer, the first magnetic layer having a fixed magnetization orientation and the second magnetic layer comprising cobalt-iron-boron (CoFeB);
   forming a conductive capping pattern on the second magnetic layer;
   oxidizing the second magnetic layer, using the conductive capping pattern as a mask, to form a second magnetic pattern having an unoxidized portion disposed below the conductive capping pattern;
   removing an oxidized portion of the second magnetic layer to expose at least a portion of an upper surface of the tunnel barrier layer opposite the first magnetic layer and to expose opposing sidewalls of the second magnetic pattern; and
   successively patterning the exposed tunnel barrier layer and the first magnetic layer to form a first magnetic pattern and a tunnel barrier pattern that are sequentially stacked,
   wherein a surface of the tunnel barrier pattern opposite the first magnetic layer is wider than a first surface of the second magnetic pattern that is in contact with the tunnel barrier pattern; and
   wherein removing the oxidized portion of the second magnetic layer comprises etching the oxidized portion of the second magnetic layer using an etch gas including argon gas, chlorine gas, and oxygen gas.

14. The method of claim 13, wherein:
   etching the oxidized portion of the second magnetic layer process is performed using an etch recipe in which an inflow rate of the argon gas is about 200 sccm, an inflow rate of the chlorine gas is about 1.0 sccm, an inflow rate of the oxygen gas is about 20 sccm and bias power is about 50 watts.

15. The method of claim 13, wherein:
   the first magnetic layer comprises a pinning layer, a first pinned layer, an inversion layer, and a second pinned layer,
   the first and second pinned layers comprising a ferromagnetic material,
   the pinning layer comprising an antiferromagnetic material configured to fix a magnetization orientation of the first pinned layer, and
   the inversion layer comprising ruthenium (Ru), iridium (Ir), and/or rhodium (Rh), and configured to fix a magnetization orientation of the second pinned layer to be opposite to the magnetization orientation of the first pinned layer.

16. The method of claim 13, wherein:
   the tunnel barrier layer comprises aluminum oxide and/or magnesium oxide.

* * * * *